US012575169B2

(12) United States Patent
Escoffier

(10) Patent No.: US 12,575,169 B2
(45) Date of Patent: Mar. 10, 2026

(54) COMPACT SWITCHING CIRCUIT PROVIDED WITH HETEROJUNCTION TRANSISTORS

(71) Applicant: COMMISSARIAT A L'ENERGIE ATOMIQUE ET AUX ENERGIES ALTERNATIVES, Paris (FR)

(72) Inventor: René Escoffier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 919 days.

(21) Appl. No.: 17/838,702

(22) Filed: Jun. 13, 2022

(65) Prior Publication Data

US 2022/0406772 A1 Dec. 22, 2022

(30) Foreign Application Priority Data

Jun. 14, 2021 (FR) ...................................... 21 06222

(51) Int. Cl.
*H10D 84/80* (2025.01)
*H10D 8/01* (2025.01)
(Continued)

(52) U.S. Cl.
CPC ........... *H10D 84/811* (2025.01); *H10D 8/051* (2025.01); *H10D 8/60* (2025.01); *H10D 62/106* (2025.01); *H10D 62/136* (2025.01)

(58) Field of Classification Search
CPC ........ H10D 84/811; H10D 8/051; H10D 8/60; H10D 62/106; H10D 62/136;
(Continued)

(56) References Cited

U.S. PATENT DOCUMENTS 7,245,175 B2 * 7/2007 Morita ................. H03K 17/567
327/427
8,723,178 B2 * 5/2014 Li .......................... H10D 84/83
257/77
(Continued)

FOREIGN PATENT DOCUMENTS

FR 3 028 666 A1 5/2016
JP 2010-166793 A 7/2010
JP 2013-041976 A 2/2013
KR 10-2016-0077936 A 7/2016

OTHER PUBLICATIONS

Preliminary French Search Report issued Feb. 8, 2022 in French Application 21 06222 filed on Jun. 14, 2021, 2 pages (with English Translation of Categories of Cited Documents).

*Primary Examiner* — Steven B Gauthier
*Assistant Examiner* — Khatib A Rahman
(74) *Attorney, Agent, or Firm* — Oblon, McClelland, Maier & Neustadt, L.L.P.

(57) ABSTRACT

A switching circuit forming a bidirectional switch between a first node and a second node and resting on a substrate includes a first branch with a first diode in series with a first heterojunction field-effect transistor, and a second branch with a second heterojunction field-effect transistor in series with a second diode, the first branch and the second branch being mounted in parallel to one another and so that the first diode and the second diode are arranged in antiparallel or in anti-series with respect to one another. The first transistor and the second transistor are each provided with a control gate facing a heterojunction band forming an active zone in which an electron gas is capable of being formed. The first diode is a Schottky diode with a metal electrode in contact with the heterojunction band, and the second diode is a Schottky diode with a metal electrode in contact with the heterojunction band. The first diode, the first transistor, the (Continued)

second diode, and the second transistor share the same active zone.

9 Claims, 9 Drawing Sheets

(51) Int. Cl.
*H10D 8/60* (2025.01)
*H10D 62/10* (2025.01)
*H10D 62/13* (2025.01)

(58) Field of Classification Search
CPC ............. H10D 30/475; H10D 62/8503; H10D 64/513; H10D 84/01; H10D 84/82; H10D 89/10; H10D 84/05
See application file for complete search history.

(56) References Cited

U.S. PATENT DOCUMENTS

| | | | | |
|---|---|---|---|---|
| 9,356,017 | B1 * | 5/2016 | Siemieniec | H10D 30/475 |
| 11,139,290 | B2 * | 10/2021 | Lin | H10D 84/811 |
| 12,125,845 | B2 * | 10/2024 | Liao | H10D 30/015 |
| 12,125,847 | B2 * | 10/2024 | He | H10D 84/82 |
| 2003/0080355 | A1 * | 5/2003 | Shirai | H10D 84/156 |
| | | | | 257/E29.066 |
| 2009/0065810 | A1 * | 3/2009 | Honea | H10D 64/411 |
| | | | | 257/192 |
| 2009/0206363 | A1 | 8/2009 | Machida et al. | |
| 2011/0254056 | A1 | 10/2011 | Machida et al. | |
| 2015/0249151 | A1 | 9/2015 | Reiner | |
| 2018/0109254 | A1 * | 4/2018 | Kartal | H03K 17/74 |

* cited by examiner

COMPACT SWITCHING CIRCUIT PROVIDED WITH HETEROJUNCTION TRANSISTORS

TECHNICAL FIELD

The present application relates to the field of switching circuits, in particular power switching, intended to carry out voltage and/or current switching, and including at least one operation bidirectional in voltage or in current or in voltage and in current.

It relates in particular to the creation of an improved switching circuit that can function as a 4-quadrant switch and capable of being used in particular for an energy conversion, in particular in a range between several milliwatts and several tens of watts.

PRIOR ART

To carry out a bidirectional, also called 4-quadrant, switch function various arrangements exist.

It is known in particular to provide a circuit branch in which the following are associated:

an FET (for Field-Effect Transistor) transistor and a diode connected in series, or an IGBT (for Insulated Gate Bipolar Transistor) transistor and a diode connected in series or a GTO thyristor (from Gate Turn-Off Thyristor) and a diode connected in series, or even an IGCT (for Integrated Gate Commutated Thyristor) thyristor.

Such a branch allows to carry out a function of a switch bidirectional in voltage and unidirectional in current. To carry out the function of a switch bidirectional in current two such branches are thus associated in anti-parallel.

Thus a base cell $C_1$ of a bidirectional switch is illustrated in FIG. 1 and here is formed by two branches 7a, 7b arranged top to tail and each provided with a switch element prohibiting the passage of the current under certain conditions (auto-blocking or controlled blocking) and allowing this passage the rest of the time (auto-priming and controlled priming).

A component bidirectional in voltage and in current is thus obtained, one ideal current-voltage characteristic of which is schematically shown in FIG. 2, in an orthogonal reference frame defining four quadrants Q1 (positive voltage positive current), Q2 (negative voltage positive current), Q3 (negative voltage negative current), Q4 (positive voltage negative current). For this component that is also called 4-quadrant switch, the auto-switching occurs here in quadrants Q2 and Q4, with respectively on the one hand spontaneous blocking at zero current and spontaneous priming at zero voltage, and on the other hand spontaneous blocking at zero current and spontaneous priming at zero voltage. The document FR3°028°666°A1 provides a particular bidirectional switch structure formed by 4 heterojunction field-effect transistors (or HEMT for High-Electron-Mobility Transistor) distributed into two branches, two transistors $T_{12}$, $T_{21}$ being assembled as a diode, the two others $T_{11}$, $T_{22}$ according to a conventional assembly.

Such a structure adapts especially to power uses, since it is formed by transistors having a high breakdown voltage, with a reduced conduction resistance and a potentially high current density.

As visible in FIG. 3B, the structure is formed in two distinct active zones 15A, 15B spaced apart from one another, each of the active zones being formed by a stack of semiconductor layers respectively containing GaN and containing AlGaN forming a heterojunction. Each branch of the switching structure is thus formed by an active zone 15A, 15B in which a 2D electron gas is produced. The two active zones are typically separated here from one another via an insulating zone 13 for example in the form of a trench.

One disadvantage of such a structure is its bulk, the latter occupying a total surface area equal to that of the two individual active zones to which the insulation zone between the two active zones is added.

Moreover, using transistors mounted as a diode involves a triggering voltage Vf equal to the threshold voltage Vth of the transistor, which leads to losses in the on state.

The problem of finding a new switching structure improved with respect to the disadvantages mentioned above thus arises.

DISCLOSURE OF THE INVENTION

According to one aspect the present invention relates to a switching circuit forming a bidirectional switch between a first node and a second node and resting on a substrate, the substrate being covered with a heterojunction band forming an active zone in which an electron gas is capable of being formed, said circuit being provided:

with a first branch formed, between an end connected to the first node and another end connected to the second node: by a first diode in series with a first heterojunction field-effect transistor, with a second branch formed, between an end connected to the first node and another end connected to the second node: by a second heterojunction field-effect transistor in series with a second diode, the first branch and the second branch being mounted in parallel to one another and so that the first diode and the second diode are arranged in anti-series or antiparallel with respect to one another, the first transistor, the second transistor being each provided with a control gate facing a heterojunction band forming an active zone in which an electron gas is capable of being formed, the first diode being a Schottky diode provided with a metal electrode called "first metal electrode" in contact with said heterojunction band, the second diode being a Schottky diode provided with a metal electrode called "second metal electrode" in contact with said heterojunction band, the first diode, the first transistor, the second diode, the second transistor sharing said same active zone.

A diode and a transistor in series mounted in anti-series or in antiparallel are advantageously associated here and Schottky diodes, the semiconductor zone of which is shared with that of the transistor, are used.

Advantageously the drain of the first transistor and the drain of the second transistor can be connected to one another. In this case the transistors are in anti-series.

Thus the first diode, the first transistor, the second diode, the second transistor are arranged respectively so that when the first branch is turned on a first current is capable of circulating in said band between the first metal electrode and a first conduction electrode of the first transistor, when the second branch is turned on a second current is capable of circulating in said same heterojunction band between the second metal electrode and a first conduction electrode of the second transistor.

With respect to a circuit as implemented according to the prior art, the losses in the on-state are limited and only a single active zone is used to create the two switching branches. This thus allows to gain in compactness by a factor of two on the surface area occupied on a substrate on which the circuit rests. This represents an advantage in terms of manufacturing on a chip and packaging cost.

According to a first arrangement possibility, the switching circuit includes, facing the active zone in this order, and in a first direction x parallel to a main plane of the substrate: a first conduction electrode of the first transistor, a second conduction electrode of the first transistor, said first metal electrode belonging to the first diode, a first conduction electrode of the second transistor, a second conduction electrode of the second transistor, the second metal electrode belonging to the second diode.

Advantageously, the first metal electrode and the second metal electrode extend parallel to a second direction, orthogonal to the first direction, and have respective lengths measured parallel to the second direction greater than or equal to a width of the active zone measured in the second direction.

According to a second arrangement possibility, the switching circuit can include, facing the active zone in a first direction parallel to a main plane of the substrate: a first conduction electrode of the second transistor, the control gate of the second transistor, the first metal electrode, the second metal electrode, the control gate of the first transistor, a first conduction electrode of the first transistor, the first metal electrode and the second metal electrode being arranged between the control gate of the second transistor and the control gate of the first transistor.

Advantageously, the first transistor and the second transistor include a second conduction electrode, the second conduction electrode being shared by the first transistor and the second transistor, said second shared conduction electrode being arranged between the first metal electrode and the second metal electrode.

Advantageously, the first metal electrode and the second metal electrode extend parallel to a second direction, orthogonal to the first direction, and have respective lengths measured parallel to a second direction smaller than a width of the active zone measured in the second direction, so that in the second direction a portion of the active zone located in the extension of the first metal electrode is not covered by the first metal electrode and so that in the second direction another portion of the active zone located in the extension of the second metal electrode is not covered by the second metal electrode.

According to a specific embodiment, the first transistor and/or the second transistor has a first conduction electrode typically a source electrode and a second conduction electrode typically a drain electrode each formed by an ohmic contact.

According to a third arrangement possibility, the switching circuit can include, facing the active zone in a first direction x parallel to a main plane of the substrate a first region and a second region juxtaposed with the first region: the first branch and the second branch, divided respectively between the first region and the second region, the first branch including, on a first axis parallel to the second direction and forming a non-zero angle with the first direction and in particular orthogonal to the first direction: the first metal electrode, the control gate of the first transistor, a first conduction electrode of the first transistor, the second branch including on a second axis parallel or substantially parallel to the first axis: a first conduction electrode of the second transistor, the control gate of the second transistor, the second metal electrode, the first metal electrode and the second metal electrode being distributed on a third given axis forming a non-zero angle with the first axis and the second axis, the control gate of the first transistor and the control gate of the second transistor being distributed on a fourth axis forming a non-zero angle with the first axis (A1), the second axis (A2), and said third axis.

"Substantially parallel" means here which form with respect to one another an angle smaller than 10°.

Advantageously, the first transistor and/or the second transistor include a control gate which partly surrounds the first conduction electrode.

According to a specific embodiment, the first transistor and the second transistor each include a first conduction electrode comprising a metal zone in contact with said heterojunction band, and wherein the first transistor and the second transistor include a second conduction electrode formed by a zone of said heterojunction band.

Advantageously, the heterojunction band is surrounded by a structure configured to prevent the diffusion of the 2D gas around said heterojunction band such as an insulating zone or a doped zone, in particular doped with argon.

According to an advantageous embodiment, the first transistor and the second transistor are HEMT high-electron-mobility transistors, said heterojunction band being formed by a first semiconductor layer in particular containing AlGaN stacked on a second semiconductor layer, in particular made of GaN.

The present invention also relates to a power electronic device comprising a converter, in particular AC/DC or DC/AC or AC/AC, provided with a plurality of switching cells, each switching cell being provided with a switching circuit as defined above.

BRIEF DESCRIPTION OF THE DRAWINGS

The present invention will be better understood upon reading the description of exemplary embodiments given, for purely informational and in no way limiting purposes, while referring to the appended drawings in which.

Figures 1, 2, 3A, 3B, 4:
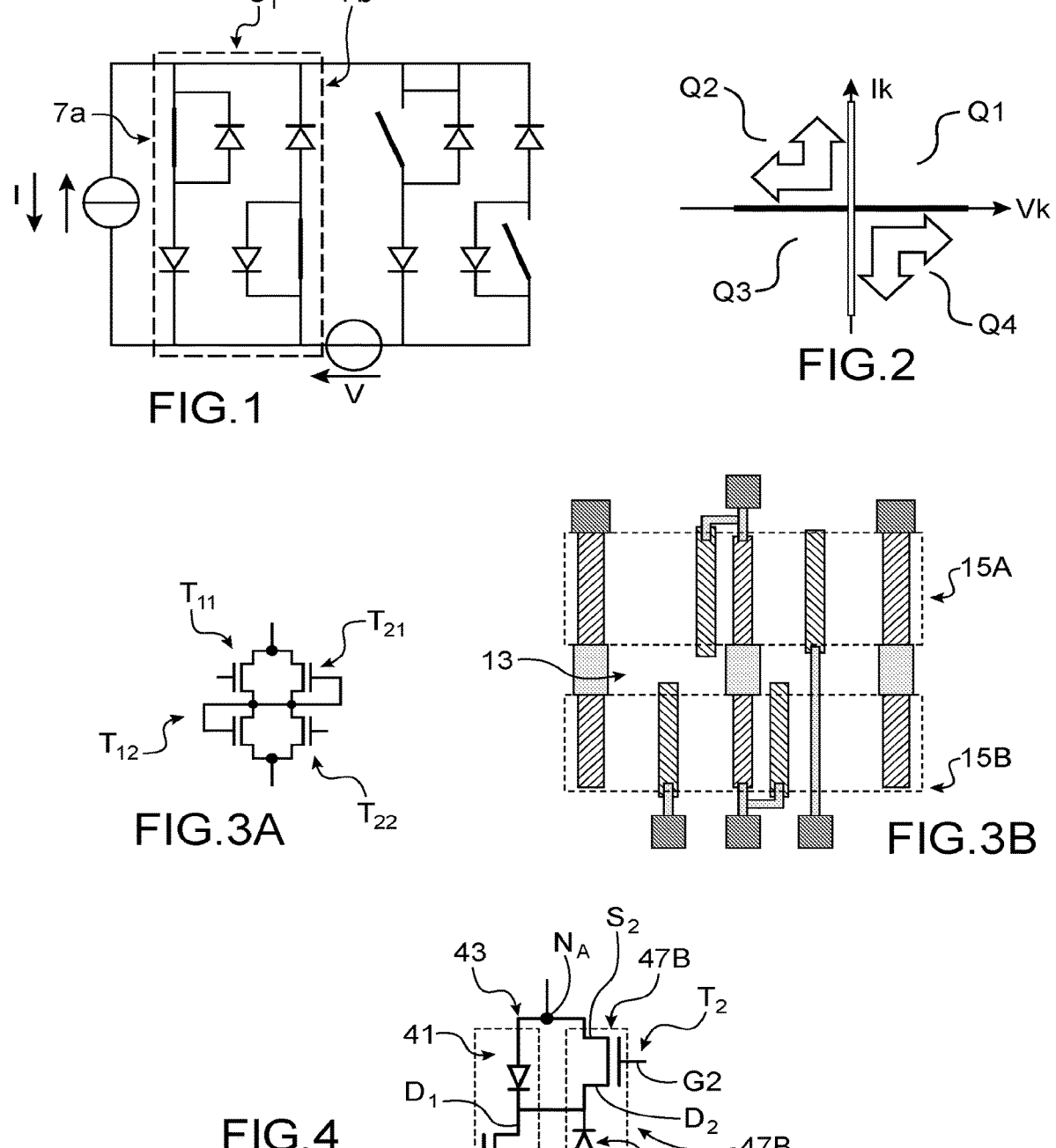
FIG. 1 is used to illustrate an electric diagram of an integrated switching circuit, the cells of which form a bidirectional switch.
FIG. 2 is used to illustrate an ideal current-voltage characteristic of a 4-quadrant switch.
FIGS. 3A, 3B are used to illustrate an integrated switching circuit according to the prior art forming a 4-quadrant switch adapted to power uses and made from four HEMT transistors, two of which are mounted as a diode to form two distinct branches of circuits made in two distinct active zones insulated from one another.
FIG. 4 is used to illustrate a switching circuit implemented according to the present invention with heterojunction transistors and Schottky diodes to form two switching branches this time in a single active zone.

Identical, similar or equivalent parts of the various drawings carry the same numerical references so as to facilitate the passage from one drawing to another.

The various parts shown in the drawings are not necessarily on a uniform scale, to make the drawings more readable.

DETAILED DISCLOSURE OF SPECIFIC EMBODIMENTS

FIG. 4 is a diagram of a switching circuit $C_{10}$ as implemented according to the invention and configured to function as a 4-quadrant switch, bidirectional in voltage and in current. The switching circuit $C_{10}$ is provided with two nodes NA, NB and includes, between these nodes NA, NB, a first branch 47A, one end of which is connected to the first node NA and another end of which is connected to the second node NB. A second branch 47B of the circuit placed in parallel to the first branch is also provided with one end connected to the first node NA and another end connected to the second node NB.

The switching circuit $C_{10}$ comprises a first transistor $T_1$ and a second transistor $T_2$, each of the heterojunction field-effect type, in particular with high mobility, advantageously with high electron mobility (HEMT), as well as a first diode 41, and a second diode 42, in particular diodes of the Schottky type each provided with a metal electrode in contact with a heterojunction band (not shown in FIG. 4). The heterojunction band is typically provided with two adjoining semiconductor layers in particular stacked and containing different gap materials. The heterojunction can be made for example via an AlGaN/GaN stack.

More precisely, the first branch 47A includes the first diode 41 in series with the first transistor $T_1$, while the second branch 47B, parallel to the first branch 47A, includes the transistor $T_2$ in series with the second diode 42. The diodes 41, 42 are connected in anti-series with respect to one another. Thus, when the first diode 41 is on, a current coming from the first node NA is capable of crossing the first diode

41, while when the second diode 42 is on, a current coming from the second node NB is capable of crossing the second diode 42.

The first node NA is connected to a first conduction electrode, here source S2 of the second transistor $T_2$, and to an anode 43, of the first Schottky diode 41, while the second node NB is connected to a first conduction electrode, here source S1 of the first transistor $T_1$, and to an anode 45, of the second Schottky diode 42. The first transistor $T_1$ and the second transistor $T_2$ can be each provided with a second conduction electrode D1, D2, here drain, the second conduction electrodes D1 and D2 being connected to another electrode, here the cathode, respectively of the first diode 41 and of the second diode 42.

The first transistor $T_1$ and the second transistor $T_2$ are also each provided with a control gate $G_1$, $G_2$ to allow to control the conduction state of the transistors $T_1$ and $T_2$. The control potentials applied respectively to the transistors determine whether they are in an on or off state and the selective establishment of a current between the conduction electrodes. The gates can be controlled independently of one another via a control circuit (not shown) connected to these control gates $G_1$, $G_2$. The control voltages of the gates are applied respectively with respect to the electrodes S1 and S2. When it is considered that the connection between the drain electrodes D1 and D2 is optional, the diodes are in anti-parallel with respect to one another.

An alternative configuration without providing a specific conductive track on the active zone to connect to each other the drain electrodes is possible. Such a circuit allows to form a power switch with an operation bidirectional in current and/or in voltage with reduced conduction losses.

The use of the heterojunction transistors $T_1$, $T_2$ makes the switching circuit particularly adapted to power uses, since these transistors $T_1$, $T_2$ have a high breakdown voltage, with a reduced conductive resistance and a potentially high current density.

The switching circuit has here the particularity of having the first transistor $T_1$, the second transistor $T_2$, the first diode 41, the second diode 42 which are formed from the same heterojunction band in which an electron gas is capable of extending. Thus, it is intended to create the two branches 47A, 47B of the circuit in the same single heterojunction band forming the same single active zone. This is possible because a portion of the diodes is made in the stack of semiconductor layers forming the heterojunction.

This allows a significant gain in compactness, which favours the integration density. A gain in surface area by a factor of 2 can be in particular obtained with respect to a structure as shown previously in relation to FIG. 3B, and a factor of 3 can be obtained with respect to a circuit formed from four discrete components. Besides the gain in space, such a configuration allows to make the method for manufacturing the circuit less costly.

Figure 5:
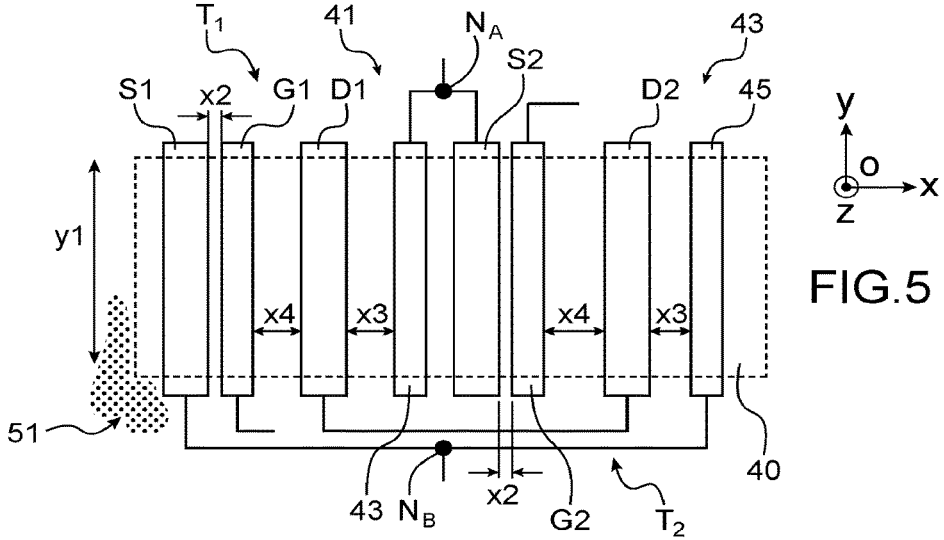
FIG. 5 is used to illustrate a top view of a first embodiment of a switching circuit structure according to the invention.

FIG. 5 gives a top view of a first example of topography of such a switching circuit, with an active zone 40, in which an electron gas is capable of being formed, shown here schematically by a dotted-line frame.

The first transistor $T_1$ and the second transistor $T_2$, as well as the first Schottky diode and the second Schottky diode are disposed along the same heterojunction band, which can have an elongated shape, and intended to form the active zone 40. The heterojunction band is made on a substrate that is not shown in this drawing but a main plane of which extends parallel to the plane [O; x; y] of the orthogonal reference frame [O; x; y; z] given in FIG. 5.

In the specific exemplary embodiment illustrated, the active zone 40 has a rectangular or substantially rectangular shape with a first dimension (not referenced) in particular its length measured parallel to a first direction along the axis x of the orthogonal reference frame [O; x; y; z], and a second dimension y1, in particular its width, measured parallel to a second direction along the axis y of the orthogonal reference frame [O; x; y; z].

The arrangement is provided here so that the circuit includes in its first direction: a first conduction electrode of the first transistor $T_1$, here its source S1, the control gate G1 of the first transistor $T_1$, a second conduction electrode of the first transistor $T_1$, here its drain D1, a metal electrode 43 of the first diode 41, a first conduction electrode of the second transistor $T_2$, here its source S2, the control gate G2 of the second transistor $T_2$, a second conduction electrode of the second transistor $T_2$, here is drain D2, a metal electrode 45 of the first diode 41.

Advantageously, the electrodes S1, G1, D1, 43, S2, G2, D2, 45 are disposed parallel to each other and extend orthogonally to the first direction, in other words are directed in the direction of the width of the heterojunction band.

In this exemplary embodiment, the arrangement of the electrodes S1, G1, D1, 43, S2, G2, D2, 45 is such that they cover the active zone 40 over its entire width y1. Thus, the first metal electrode 43 and the second metal electrode 45 form metal bands that extend parallel to the second direction y and have respective lengths which can be greater than or equal to the width y1 of the active zone 40.

To delimit the active zone 40, the heterojunction band can be surrounded by a structure 51 configured to prevent the presence of the 2D gas around said heterojunction band for example an insulating zone or a doped zone, for example a zone doped with argon and formed in the stack of materials of various gaps from which the heterojunction band is made.

Here advantageously for each transistor $T_1$, $T_2$, a distance x2, x'2 (dimensions measured parallel to the first direction x) between its gate G1, G2 and its source S1, S2 sufficient to support the gate polarisation voltage between the gate and the source is provided. A distance x4 (dimensions measured parallel to the first direction x) between its gate G1, G2 and its drain D1, D2 is provided preferably as sufficient to support the polarisation voltage between drain and gate. In the specific exemplary embodiment illustrated, x2 is less than x4.

A distance x3 (dimension measured parallel to the first direction x) between the metal electrode 43, 45 of each of the Schottky diodes 41, 42 and the drain D1, D2 of the given transistor with which this diode is placed in series equal to the distance x4 sufficient to support the voltage between Schottky contact and drain is also preferably provided. In the specific exemplary embodiment illustrated, x3 is equal to x4.

The table below gives examples of values of these dimensions x2, x3, x4, and of that of the electrodes and of the active zone for the arrangement of FIG. 5, Xschott, XD1, XG1, XS1, XD2, XG2, XS2 corresponding to the respective widths (dimensions measured parallel to the first direction x) of the electrodes 41 and 45, D1, G1, S1, D2, G2, S2, to support a voltage of approximately 650V and a current of approximately 50 mA.

TABLE 1

| Example of dimensions for the arrangement of FIG. 5 | Unit: μm |
|---|---|
| X2 | 0.5 |
| x3 | 10 |
| x4 | 10 |

TABLE 1-continued

| Example of dimensions for the arrangement of FIG. 5 | Unit: μm |
|---|---|
| Xschott | 1 |
| XD1 | 1 |
| XG1 | 0.5 |
| XS1 | 1 |
| XD2 | 1 |
| XG2 | 0.5 |
| XS2 | 1 |
| Total x | 48 |
| y1 | 500 |
| Total y | 500 |

Figure 6:
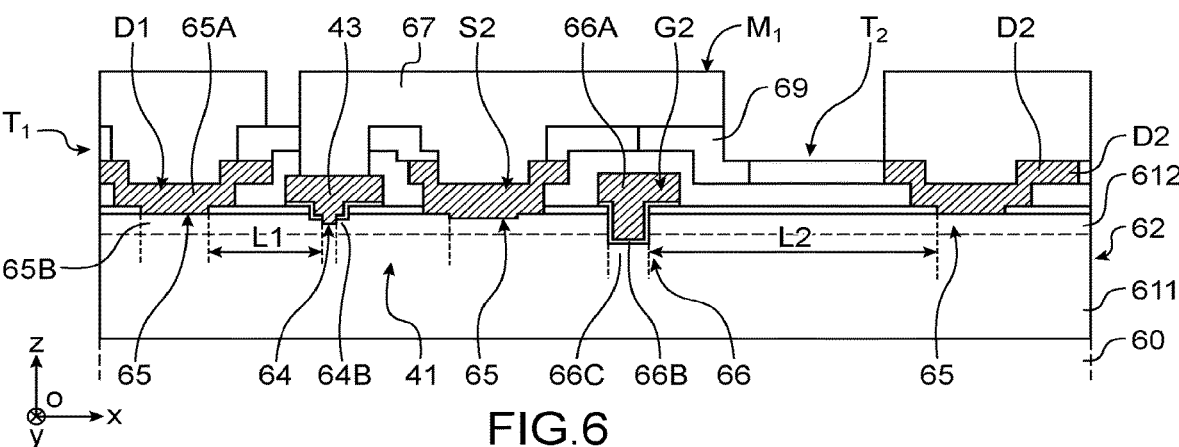
FIG. 6 is used to illustrate a partial cross-sectional view of the first embodiment of the switching circuit structure according to the invention.

In FIG. 6, a cross-sectional view of a part of the switching circuit is given. The second transistor $T_2$ provided with its electrodes D2, G2, S2, the first diode 41, the metal electrode 43 of which is located between the first transistor $T_1$, in particular its drain D1 and the second transistor $T_2$, in particular its source S2, are shown. The source, the gate of the first transistor $T_1$ as well as the metal electrode of the second diode are not shown here, however. The two branches of the circuit are thus made from the same heterojunction band 62 in which a layer of 2Deg electron gas is indicated schematically by a dashed line. The heterojunction band 62 rests on a substrate 60 which can be semiconductor, for example made of silicon or made of GaN or made of another type of material. A sapphire $(Al_2O_3)$ substrate can be in particular used.

The source and drain electrodes of the transistors $T_1$, $T_2$ are typically in the form of ohmic contacts 65 formed by a zone 65A of metal in contact with a semiconductor region 65B of the heterojunction band 62 in which metal has diffused. Alternatively to a metal diffusion, the semiconductor region 65B of the source and drain electrodes can be a doped zone made by ion implantation.

The metal electrode 43 of each diode 41 forms a Schottky contact 64 with a semiconductor region 64B of the heterojunction band 62. The semiconductor regions 64B, 65B are in particular zones of an upper semiconductor layer 612 of a stack forming the heterojunction. This upper semiconductor layer 612 is typically a "barrier" layer, formed by a ternary alloy of a nitride of an element of the type III for example such as AlGaN.

In the specific exemplary embodiment illustrated in FIG. 6, the metal electrode 43 (respectively 45) of each Schottky diode 41 (respectively 42) is connected to a conduction electrode, in particular the source S2 of the transistor $T_2$ of the other branch via a metal connection zone 67 formed in a first metal level $M_1$ of connections. This metal connection zone 67 is here more precisely in contact with the metal zone of the source electrode and can also be connected to a field plate electrode 69 placed facing a portion of the gate of the transistor $T_2$ (respectively $T_1$). Such a field plate can allow to avoid a peak of electric field at the foot of an insulating zone 66B used as a gate dielectric.

In this specific exemplary embodiment, the control gates G1, G2 form a gate contact 66 in the form of a structure of the MIS (for Metal Insulator Semiconductor) type including a metal zone 66A resting on an insulating zone 66B in contact with a semiconductor zone 66C of the heterojunction band. The stack of the metal zone 66A and of the insulating zone 66B is arranged here in a trench, the bottom of which is located in the heterojunction band, in particular in a lower semiconductor layer 611 forming with said upper semiconductor layer 612 the heterojunction.

The lower semiconductor layer 612 can be provided made of a binary alloy of a nitride of an element of the type III, for example GaN. Thus, the gate G1, G2 extends in this example under the level in which the layer of 2 Deg electron gas, the latter typically being located at the interface between the lower semiconductor layer 611 and the upper semiconductor layer 612.

Alternatively, other gate configurations with or without a trench can be provided. Among other arrangements, a gate disposed directly on the barrier layer, a gate disposed on a doped layer resting on the barrier layer, a gate arranged on an implanted zone of the barrier layer can also be provided.

The dimensioning of each portion of a Schottky diode 41 (respectively 42) in the heterojunction band 62 is preferably provided with a first minimum distance $L_1$ greater than a given threshold between a zone of the metal electrode 43 (respectively 45) in contact with the heterojunction band and a drain zone D1 (respectively D2) of the transistor $T_1$ (respectively $T_2$) with which this diode 41 is disposed in series. Such a distance is dependent and in particular proportional to a desired voltage strength for the structure.

Likewise, the dimensioning of each transistor $T_2$ (respectively $T_1$) is preferably chosen with a second minimum distance $L_2$ greater than a given threshold between a region of the heterojunction band against which its gate G2 (respectively G1) is formed and its drain D2 (respectively D1). Such a distance is also dependent and in particular proportional to a desired voltage strength for the structure.

For example, in the case in which it is desired to obtain a bidirectional voltage strength of approximately 650V, the first distance $L_1$ can be provided for example as at least 10 μm. As for the second distance $L_2$, it can be provided for example as at least 10 μm. These distances $L_1$, $L_2$ depend on the constitution of the heterojunction band and in particular on the large gap material forming this heterojunction. In the case, for example, in which this material with a large gap is made of GaN, these values can be determined by considering a strength before breakdown of approximately 3 MV/cm and typically by providing a margin in order to avoid an electric field greater than 0.3 MV/cm.

Even though a particular case of a heterojunction transistor of the AlGaN/GaN type was mentioned above, other structures with different heterojunctions for example such as GaAlAs/GaAs, or GaAlAs(N+)/InGaAs(n.d)/GaAs are also possible.

An example of a succession of steps of a method for manufacturing a switching circuit of the type of that described above will now be illustrated in relation to FIGS. 7A to 7I.

One possible starting material of the method is a substrate 700, which can be semiconductor, for example made of silicon having a thickness for example of approximately 1 mm. The substrate 700 is coated with a first semiconductor layer 702, in particular containing a semiconductor with a wide band gap and of the type III/V for example such as GaN. The first semiconductor layer 702 is itself coated with a second semiconductor layer 704 which can be formed by epitaxy and in particular containing a direct gap material for example such as aluminium gallium nitride ($Al_xGa_{1-x}N$). This layer 704 forms with the first semiconductor layer 702 a heterojunction. A layer of electron gas is intrinsically formed at the interface between these two layers 702, 704.

Figures 7A, 7B, 7C, 7D:
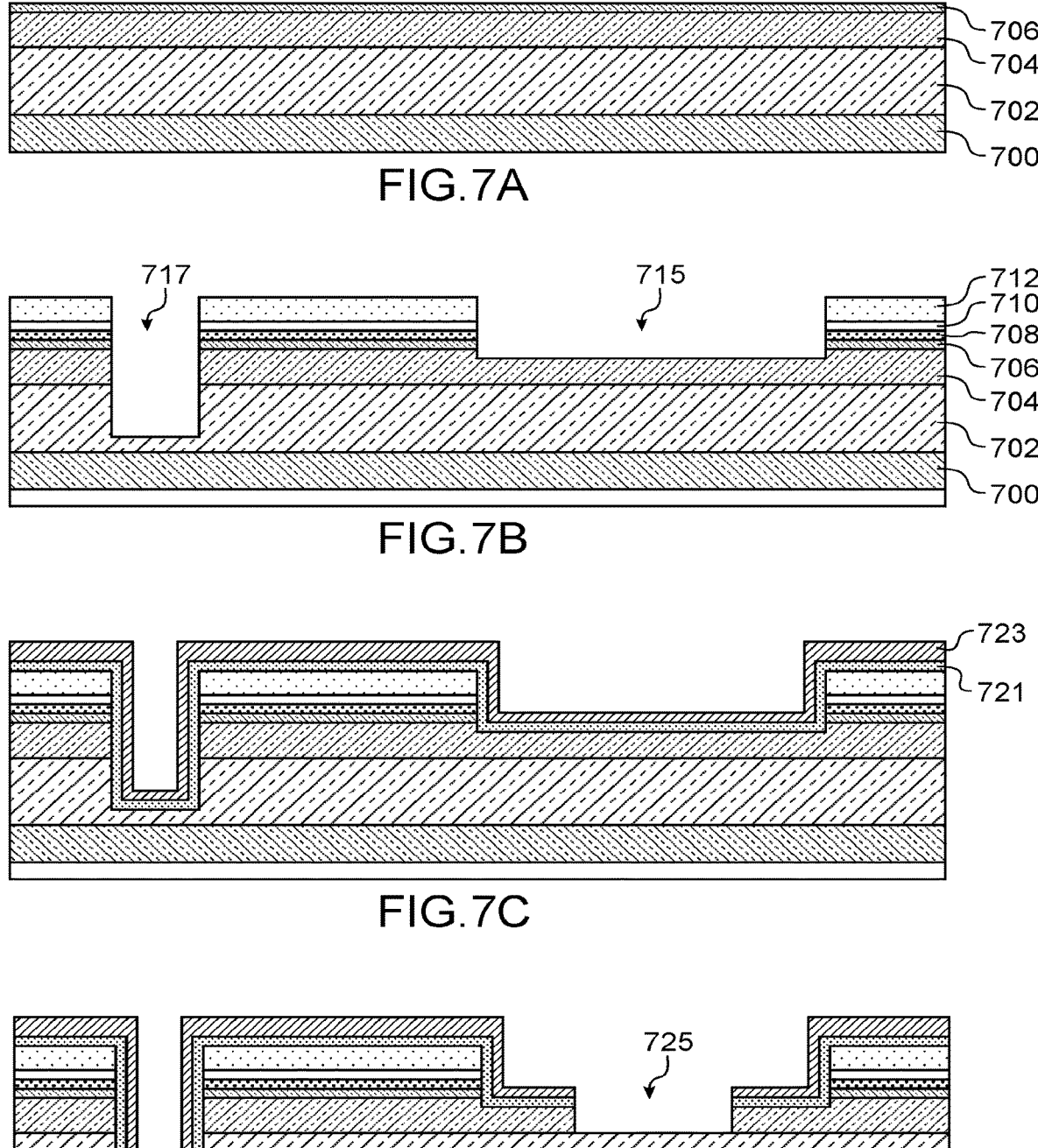
FIGS. 7A, 7B, 7C, 7D, 7E, 7F, 7G, 7H, 7I are partial cross-sectional views of a portion of the integrated switching circuit at various steps of an example of a manufacturing method.
Figure 7E:
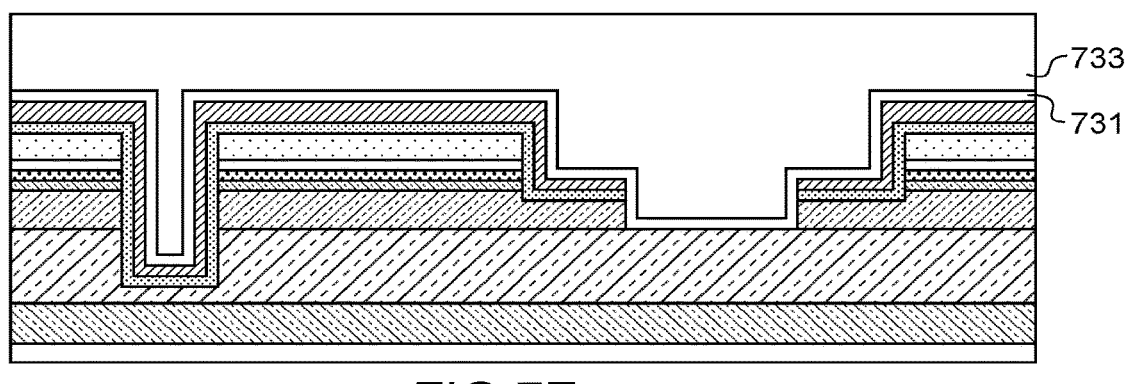

As illustrated in FIG. 7A, a first passivation layer 706 can thus be deposited on the second semiconductor layer 704.

This first passivation layer 706 is made of an insulating material for example such as silicon nitride.

In the exemplary embodiment illustrated in FIG. 7B, the first dielectric passivation layer 706 is then coated with other passivation layers so as to form an alternation of layers 706, 710 made of an insulating material for example silicon nitride and of layers 708, 712 made of another insulating material for example such as silicon oxide.

One or more steps of etching of the passivation layers 706, 708, 710, 712 can thus be implemented to form openings, including a first opening 715 giving access to the second semiconductor layer 704 and a second opening 717 made through the second semiconductor layer 704 and exposing the first semiconductor layer 702. In the specific exemplary embodiment illustrated in FIG. 7B, the creation of the first opening 715 comprises the removal of an upper portion of the second semiconductor layer 704.

According to a specific exemplary embodiment, to create the first opening 715, a thickness of approximately 10 nm can be removed from a semiconductor layer 706 of AlGaN having a thickness of approximately 25 nm. According to this same example, to create a second opening 717, a thickness of approximately 80 nm can be removed from a semiconductor layer 702 of GaN having a thickness of approximately 4 μm.

Then, a dielectric layer 721 is formed in the openings and in particular in the first opening 715 and the second opening 717. This dielectric layer 721 for example contains $Al_2O_3$ and has a thickness of approximately 30 nm and can be formed by an ALD (for Atomic Layer Deposition) technique.

Then (FIG. 7C), a metal layer 723 is deposited. This metal layer 723 for example contains TiN and has a thickness of approximately 60 nm and can be formed by a PVD (for Physical Vapour Deposition) technique.

Then (FIG. 7D) at least one orifice 725 is made at the stack located in the first opening 715 in order to expose the first semiconductor layer 704. Such an orifice 725 is typically made by photolithography and etching, for example using plasma (dry etching).

Then (FIG. 7E), one or more metal layers are deposited. Typically a stack is made of a fine metal layer 731, for example containing TiN, of 60 nm and of at least one other metal layer 733, for example tungsten having a thickness of approximately 300 nm, in order to create in the orifice 725 a contact of the Schottky type. These metal layers 731, 733 can also be used to fill the second opening 725.

Figure 7F:
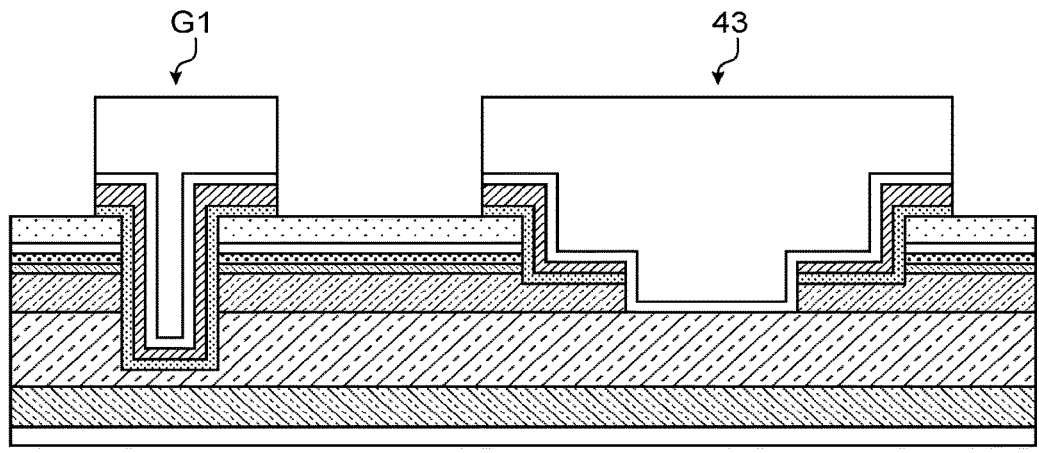

Then one or more patterns are formed by etching of the stack of layers 721, 723, 731, 733 so as to define the electrodes. In FIG. 7F, a gate electrode G1 of the first Transistor $T_1$ and a metal electrode 43 of the first diode 41 are shown.

Figure 7G:
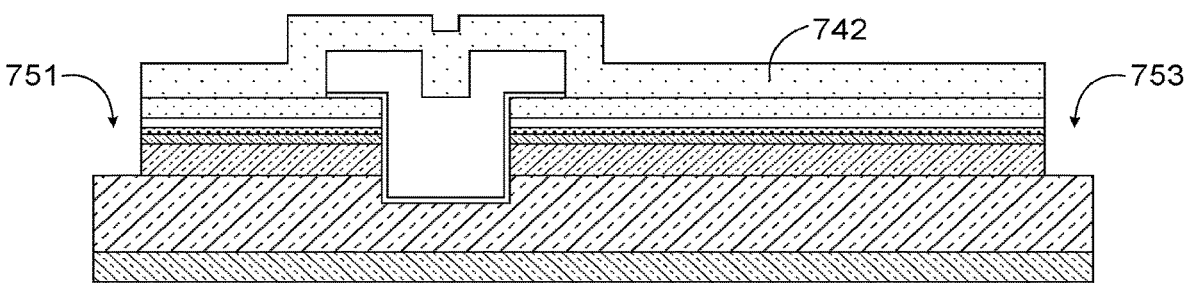

The electrodes can then be covered with an insulating layer 742 (FIG. 7G). The insulating layer 742 is made for example of $SiO_2$. A PECVD (for Plasma-Enhanced Chemical Vapour Deposition) technique can be used to create a thickness for example of approximately 150 nm.

Figure 7H:
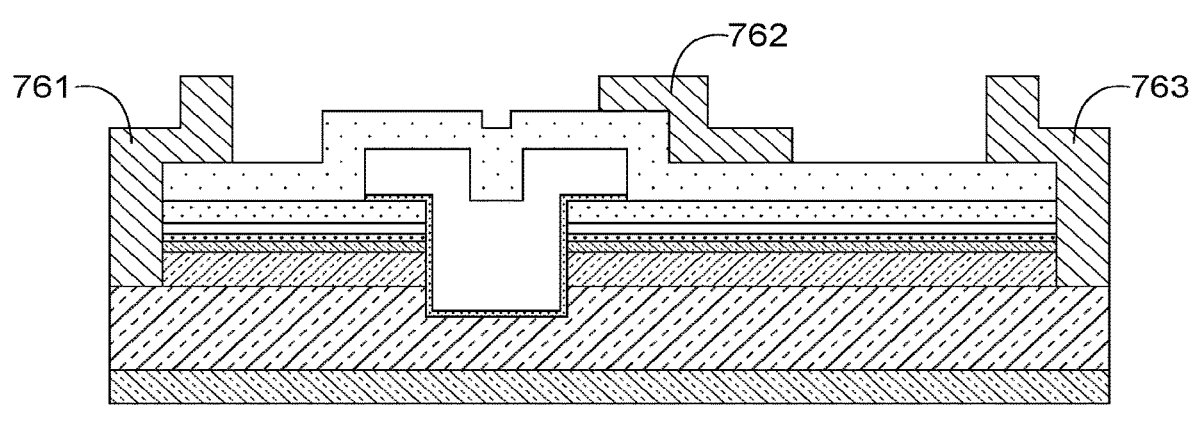

One or more connections elements 761, 762, 763 can then be defined, some of which 761, 763 are in contact with the first semiconductor layer 702 (FIG. 7H). For this, first of all holes 751, 753 exposing the first semiconductor layer 702 are made. The creation of such holes 751, 753 can comprise one or more steps of dry etching. Then, one or more metal materials are deposited. For example, first of all a layer is formed, then a barrier layer such as a layer of TiN of 60 nm according to a deposition method which can be of the PVD (for Physical Vapour Deposition) type, then a layer of Al:Cu alloy of aluminium and of copper of approximately 200 nm.

Figure 7I:
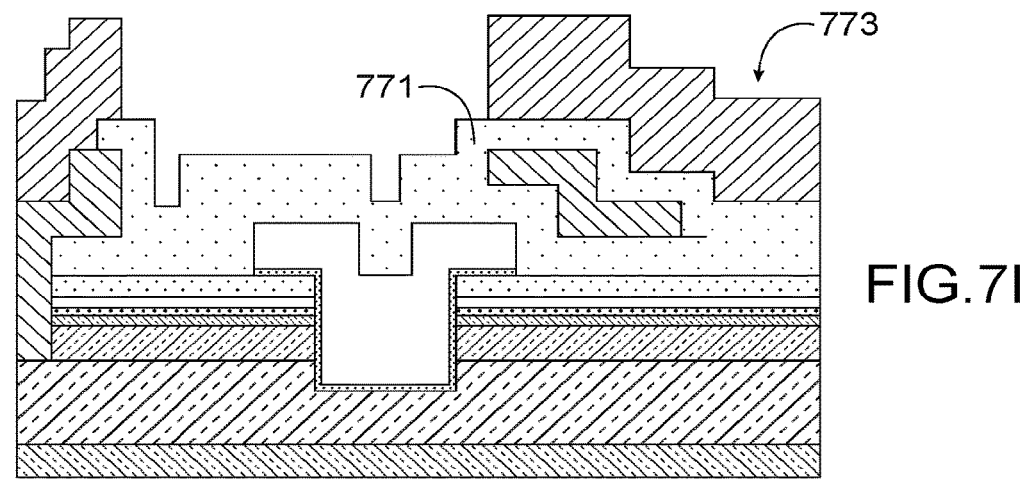

Then another insulating layer 771 is formed, then a first metal interconnection layer 773 (FIG. 7I). For this one or more metal materials are deposited. For example, first of all a layer of Ti of approximately 20 nm is formed, then a layer of TiN of approximately 20 nm and of aluminium. The deposition can be completed for example by a layer of copper of approximately 1.4 $\mu m$, of Ti of approximately 20 nm, and of TiN of approximately 40 nm. Such metal layers can be formed for example by PVD.

Figure 8:
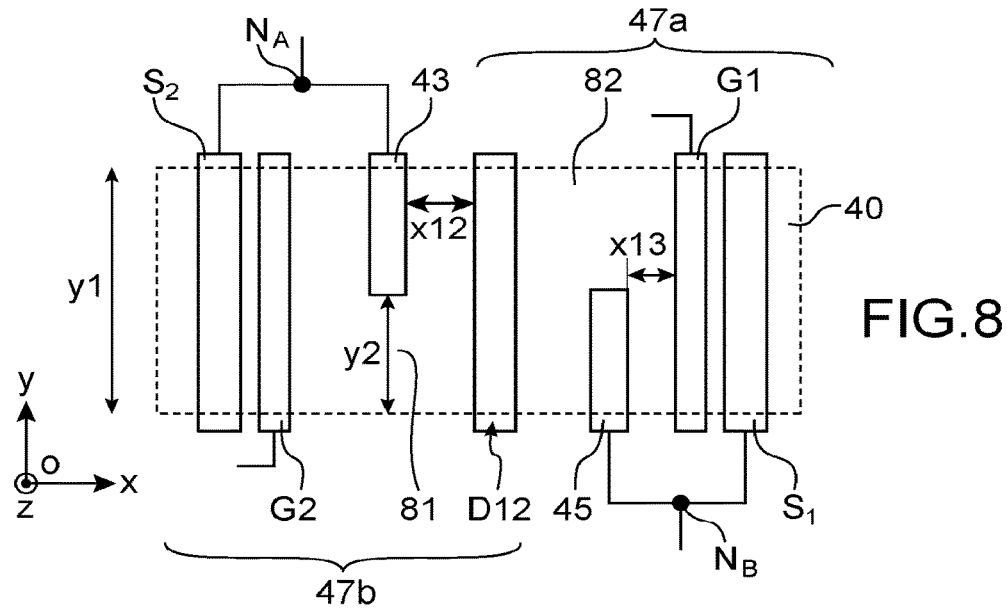
FIG. 8 is used to illustrate a switching circuit structure implemented according to a second embodiment of the present invention.

According to an alternative embodiment of the structure described above, in order to limit even further the bulk of the transistors $T_1$, $T_2$, an arrangement with a drain electrode $D_{12}$ shared by the first transistor $T_1$ and the second transistor $T_2$ can be provided like in the exemplary embodiment illustrated in FIG. 8. It is thus possible to combine the drain electrodes in a single ohmic contact and avoid using an additional metal connection above.

In the exemplary embodiment illustrated, the metal electrodes 43, 45 of the diodes 41, 42 also have, advantageously, a reduced length with respect to the other electrodes and in particular with respect to the shared drain electrode $D_{12}$. The metal electrodes 43, 45 thus only extend facing only a part of the width y1 of the active zone 40. A portion 81 of the active zone 40 located in the extension of the first metal electrode 43 and which extends in the second direction y is not covered by the first metal electrode 43. Likewise, another portion 82 of the active zone 40 located in the extension of the second metal electrode 45 and which extends in the second direction y is not covered by the second metal electrode 45. Such an arrangement allows better compactness, the portions 81, 82 of the active zone being used in this case as a channel region respectively of the second transistor $T_2$ and of the first transistor $T_1$. The two channel regions are offset here with respect to one another. The table below gives examples of values of certain dimensions of this arrangement, with in particular $x_{12}$: a distance measured parallel to the first direction x between the shared drain electrode $D_{12}$ and the first and/or the second metal electrode 43, 45, $x_{13}$: a distance measured parallel to the first direction x between the control gate G1 (respectively G2) and the metal electrode of the diode D2 belonging to the opposite branch, y2 the length of the portions 81, 82 located in the respective extension of the metal electrodes and measured parallel to the second direction y, Xschott, XD1, XG1, XS1, XD2, XG2, XS2 corresponding in the case of a circuit supporting a voltage of approximately 650V and a current of approximately 50 mA.

TABLE 2

| Arrangement of FIG. 8 | Unit: $\mu m$ |
|---|---|
| $x_{12}$ | 10 |
| $x_{13}$ | 10 |
| Xschott | 1 |
| XD1 | 0 |
| XG1 | 0.5 |
| XS1 | 1 |
| XD2 | 0 |
| XG2 | 0.5 |
| XS2 | 1 |
| Total x | 46 |
| y1 | 500 |
| y2 | ≤250 |
| Total y | 500 |

Figures 9, 10, 11:
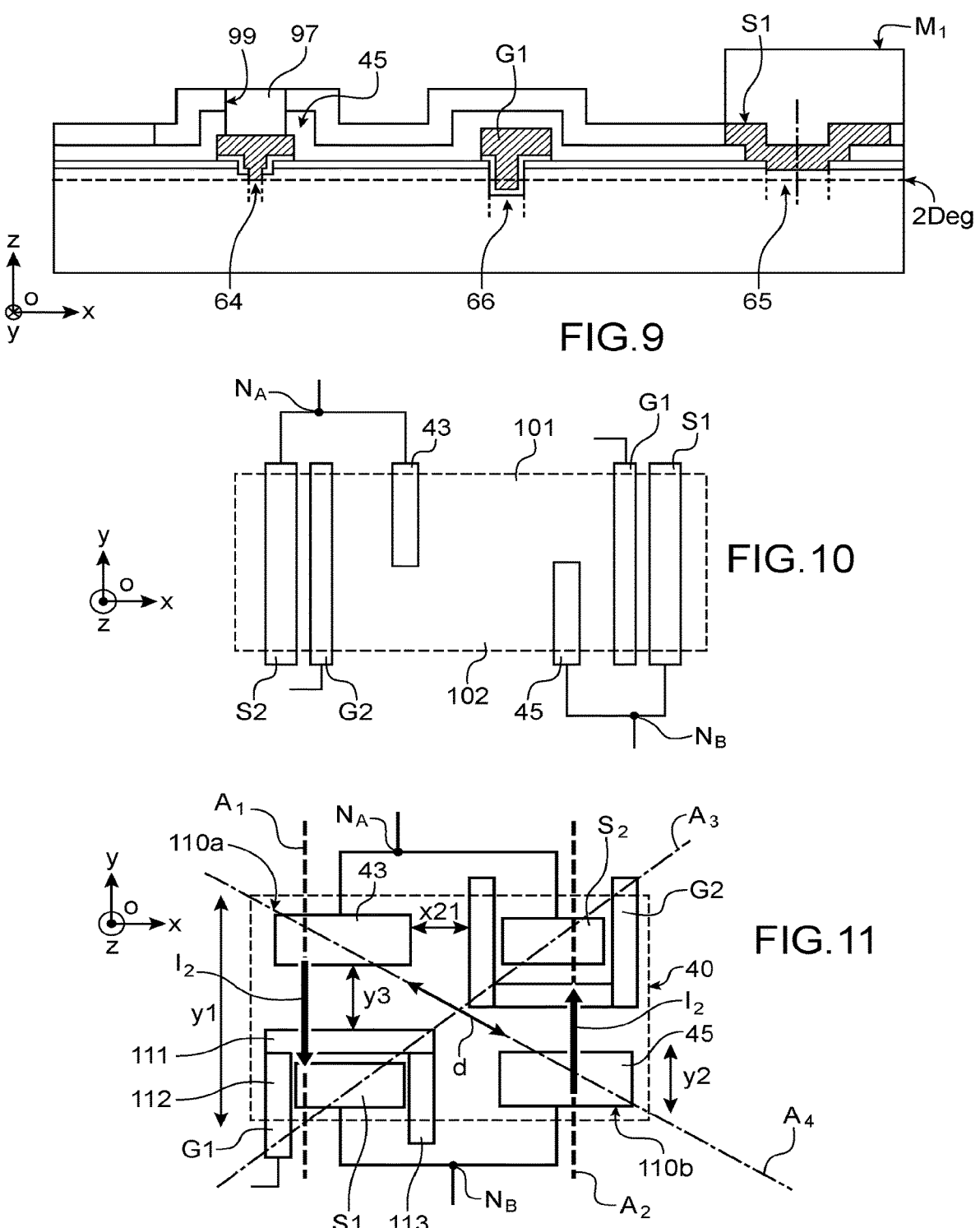
FIG. 9 is used to illustrate a partial cross-sectional view of the switching circuit structure according to the second embodiment.
FIG. 10 is used to illustrate a switching circuit structure implemented according to a third embodiment of the present invention.
FIG. 11 is used to illustrate a switching circuit structure implemented according to a fourth embodiment of the present invention.

In FIG. 9, a partial cross-sectional view (according to a cutting plane parallel to the plane [O; x; z]) of this same switching circuit is given. Only a part of the first transistor and of the second diode 43 are shown, but the two branches have similar structures. The source electrode S1 of the first transistor $T_1$ is in the form of an ohmic contact 65, the gate G1 forming an MIS structure 66 and the metal electrode of the second metal diode 45 forming a Schottky contact 64. The metal electrode 45 of the second Schottky diode 42 is connected here to a field plate electrode 99 via a metal connection zone 97 formed in a first metal level $M_1$ of connections.

An alternative of the exemplary embodiment described above in relation to FIG. 10 provides an arrangement without a metal drain electrode or without a metal zone to form the drain electrode of the transistor $T_1$, $T_2$. The drains of the transistors $T_1$, $T_2$ are thus formed respectively in zones 101, 102 of the heterojunction band which allows to once again gain in compactness of the circuit.

Another example of arrangement of the switching circuit is given in FIG. 11. The circuit includes this time facing the active zone 40 in a first direction parallel to the axis x of the reference frame [O; x; y; z] and to the main plane of the substrate all of the elements forming the first branch located in a first region 110a of the active zone 40, and all of the elements forming the second branch located in a second region 110b of said active zone 40 juxtaposed with the first region 110.

The first branch includes, on a given axis A1 in a second direction forming a non-zero angle with the first direction and in particular orthogonal to the first direction: the first metal electrode 43, the control gate G1 of the first transistor $T_1$, the source electrode S1 of the first transistor $T_1$.

The second branch includes, on an axis A2 which can be parallel to the first axis A1 and to the second direction forming a non-zero angle with the first direction and in particular orthogonal to the first direction: the source electrode S2 of the second transistor $T_2$, the control gate G2 of the second transistor $T_2$, the second metal electrode 45. In this configuration the drain contacts are eliminated. Thus, it is not necessary here to provide a specific additional track or an ohmic contact to create the drain electrodes. The drain electrode thus only consists of a portion of the semiconductor stack forming the heterojunction band.

The metal electrode 43 of the first diode and the metal electrode 45 of the second diode are distributed on an axis A4 forming a non-zero angle with the axes A1 and A2, whereas the control gate G1 of the first transistor $T_1$ and the control gate G2 of the second transistor $T_2$ are distributed on an axis A3 forming a non-zero angle with the axes A1, A2, A3.

When the first branch 47a is on (i.e. when the first diode 41 and the first transistor $T_1$ are on) a current $I_1$ oriented along the axis A1 is capable of circulating between a part of the heterojunction band located facing the first metal electrode 43 and a part of the heterojunction band located facing the source electrode S1 of the first transistor $T_1$.

When the second branch 47b is on (i.e. when the second diode 42 and the second transistor $T_2$ are on) a current $I_2$ oriented along the axis A2 is capable of circulating between a part of the heterojunction band located facing the second metal electrode 45 and a part of the heterojunction band located facing the source electrode S2 of the second transistor $T_2$. The currents $I_1$ and $I_2$ thus circulate in the heterojunction band with the same orientation but directions opposite to one another.

Advantageously, the control gates G1 and G2 partly surround respectively the source electrode S1 of the first transistor $T_1$ and the source electrode S2 of the second transistor $T_2$. The gates G1, G2 are not therefore formed here by a rectilinear zone but by portions that extend in directions difference from one another. In the exemplary embodiment illustrated in FIG. 11, the gates G1, G2 have the shape of a U around the source electrodes S1, S2. In particular, the gates G1, G2 have a portion 111 that extends in a first direction, here parallel to that corresponding to the length of the active zone and portions 112, 113 that extend in a first direction, here parallel to that x in which the length of the active zone is measured. The configuration of the gates G1, G2 allows to create an adjustable insulation between the various components forming the two branches of the circuit. Such an embodiment is adapted in particular to uses operating in ranges of current lower than those of the embodiments described above. In the specific exemplary embodiment shown, the gates G1, G2 in the shape of a U are disposed top to tail with respect to one another.

A given distance $x_{21}$ (dimension measured parallel to the direction x) is provided between each gate G1, G2 of a transistor $T_1$, $T_2$ and the metal electrode 45, 43 of the other branch. There can also be a distance y3 (dimension measured parallel to the direction y) between the metal electrode 43, 45 of each of the Schottky diodes 41, 42 and the gate of the transistor $T_1$, $T_2$ of the branch in which this diode is arranged. There can also be a distance d>y3 between the two metal electrodes 43, 45 of the Schottky diodes 41, 42.

The table below gives examples of values of these dimensions and of that of the electrodes and of the active zone for the arrangement of FIG. 11 to support a voltage of approximately 650V and a current of approximately 50 mA.

TABLE 3

| Dimensions of the exemplary embodiment of FIG. 11 | Unit: μm |
| --- | --- |
| x1 | 0.5 |
| x21 = x2 | 0.5 |
| Xschott | 500 |
| XG1 | 0.5 |
| XS1 | 500 |
| Total x | 1002.5 |
| y1 | 1 + 0.5 + 05 + 10 + 1 |
| y20 = y2 | 1 |
| y3 | 10 |
| Total y | 24 |
| Total surface area | 24060 |

Figure 12A:
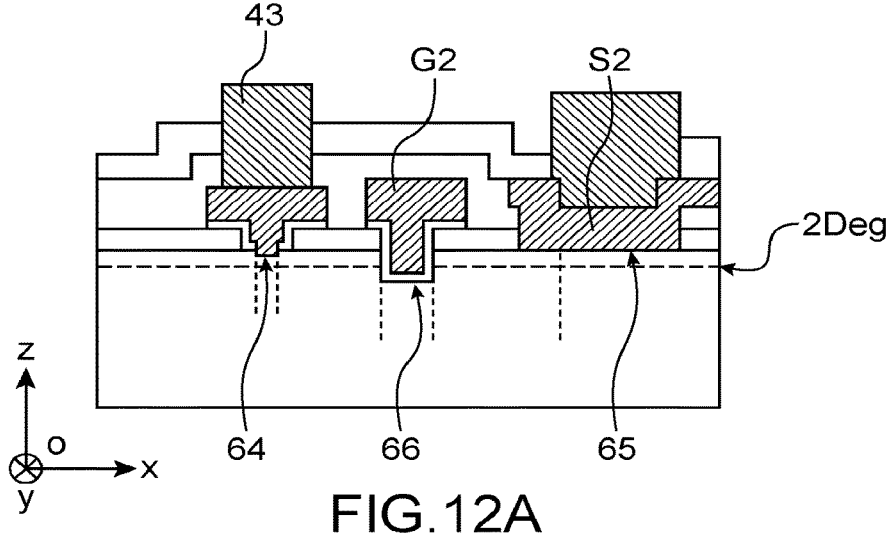
FIGS. 12A, 12B are partial cross-sectional views of a portion of an example of an integrated switching circuit according to the fourth embodiment of the present invention.
Figure 12B:
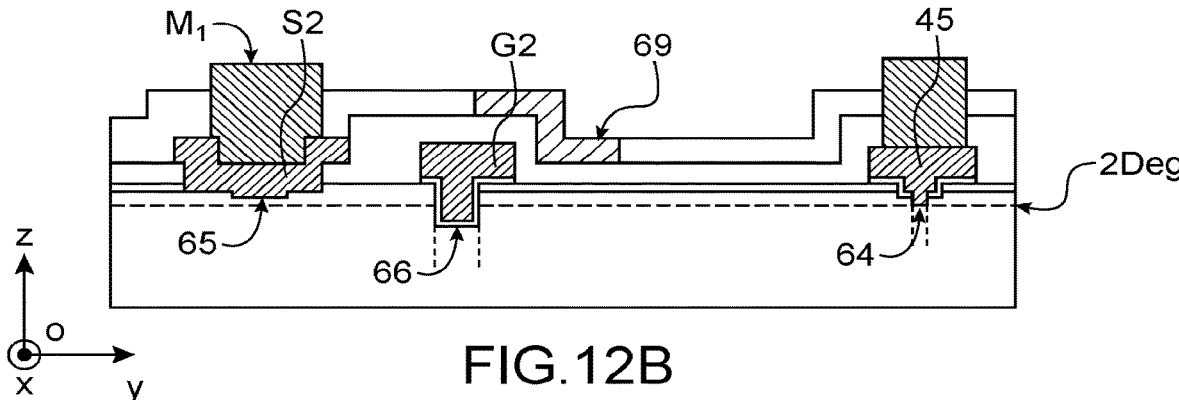

FIGS. 12A-12B give cross-sectional views, respectively according to a cutting plane parallel to the plane [O; x; y] of the orthogonal reference frame [O; x; y; z] and a cutting plane parallel to the plane [O; y; z] of the configuration example given above.

The metal electrodes 43, 45 respectively of the first diode, of the second diode form here again Schottky contacts 64, while the gates G1, G2 form a structure 66 of the MIS type. The first conduction electrode, here the source S1, S2 of the transistors $T_1$, $T_2$ is here again in the form of an ohmic contact 65.

The metal electrodes 43, 45 and the source electrodes are coated here with connection pads formed in a first metal level $M_1$.

One or the other of the structures described above in relation to FIGS. 5, 8, 10, 11 can be repeated several times on the same heterojunction band to form a switching circuit.

Even though the exemplary embodiments of the switching circuit have been described with high-electron-mobility heterojunction field-effect transistors $T_1$, $T_2$, alternatively to one or the other of the embodiments presented above it is possible to integrate therein heterojunction field-effect transistors with high hole mobility.

A switching circuit with bidirectional operation can also be used as a power switch in a power electronic device and in particular in a matrix converter.

Figure 13:
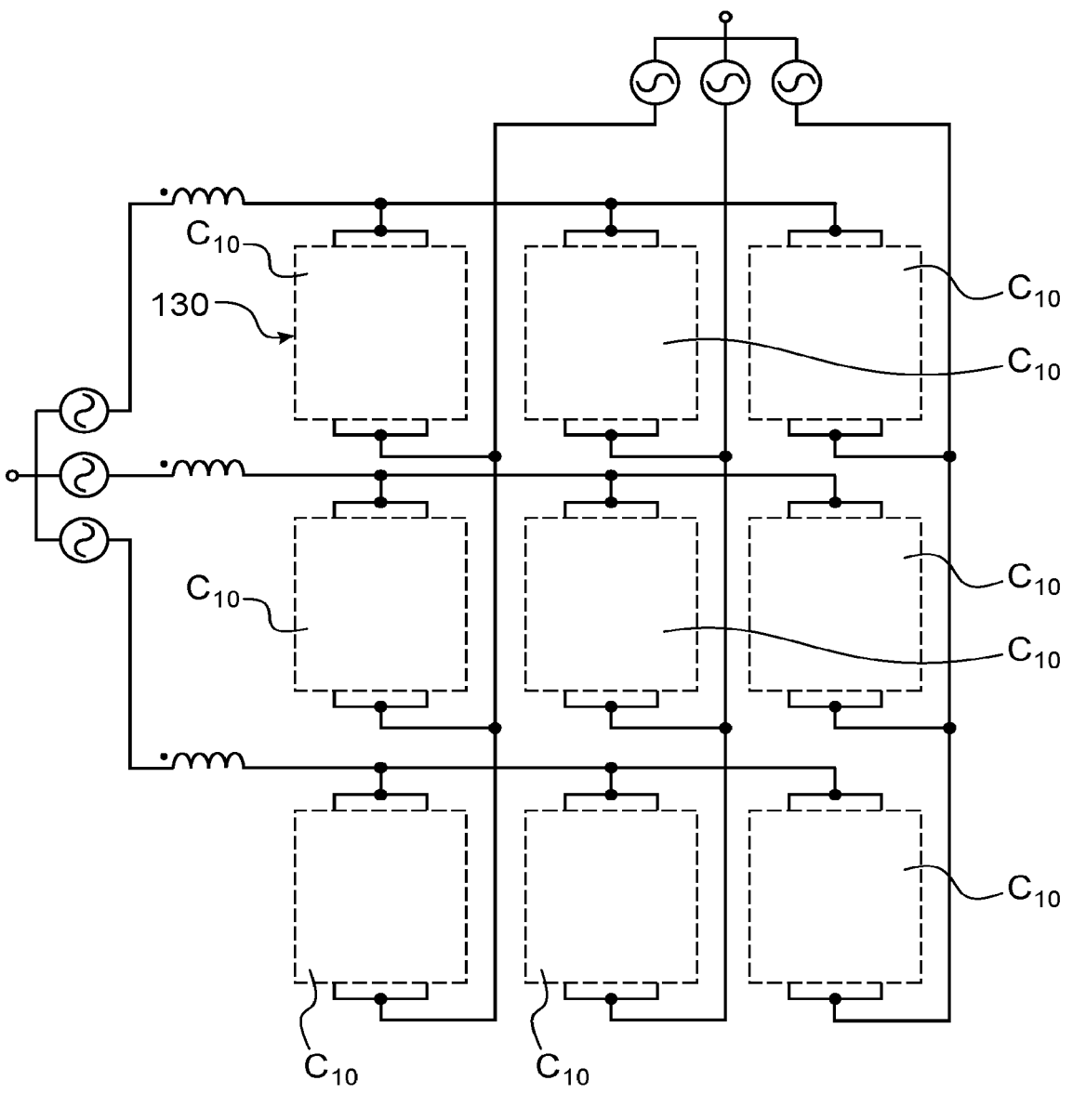
FIG. 13 is used to illustrate an AC/AC matrix converter bidirectional in voltage and current, the elementary cells of which are each formed by a switching circuit and implemented according to the present invention.

For example, as illustrated in FIG. 13, an AC/AC matrix converter is formed by a matrix of cells 130, in this example a 3*3 matrix, each provided with at least one switching circuit $C_{10}$, the block diagram of which was presented in FIG. 4 and implemented according to one or the other of the exemplary embodiments described above.

Figure 14:
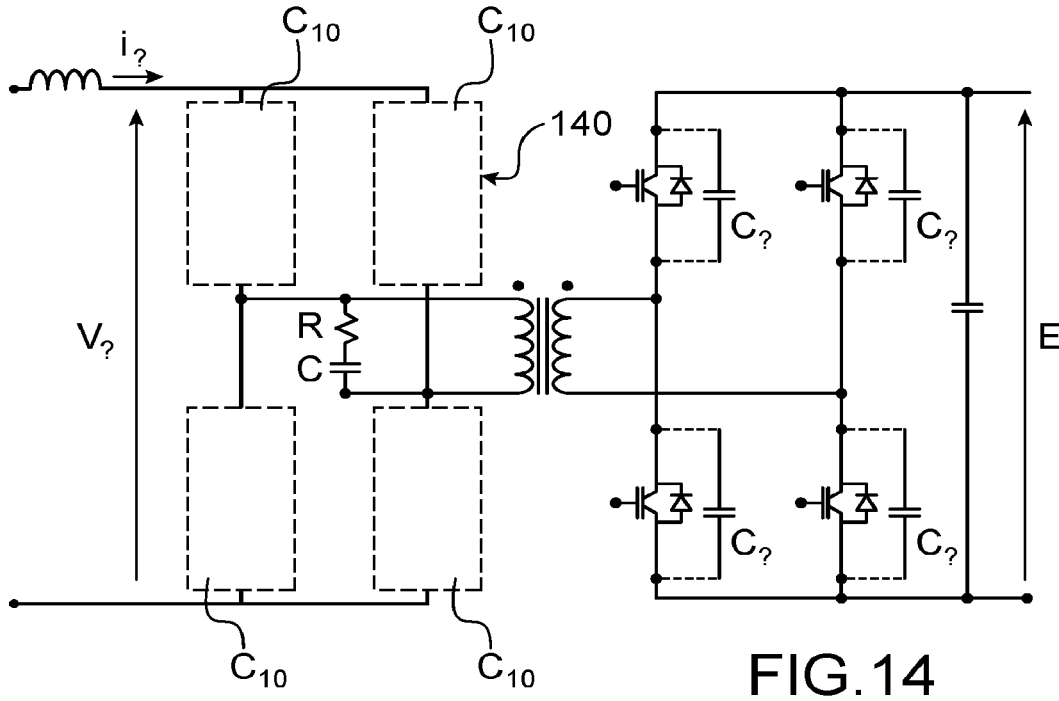
FIG. 14 is used to illustrate an AC/DC matrix converter, the elementary cells of which are each formed by a switching circuit implemented according to the present invention.

According to another example of use given in FIG. 14, an AC/AC matrix converter includes a plurality of cells 140, each formed by at least one switching circuit $C_{10}$.

Figure 15:
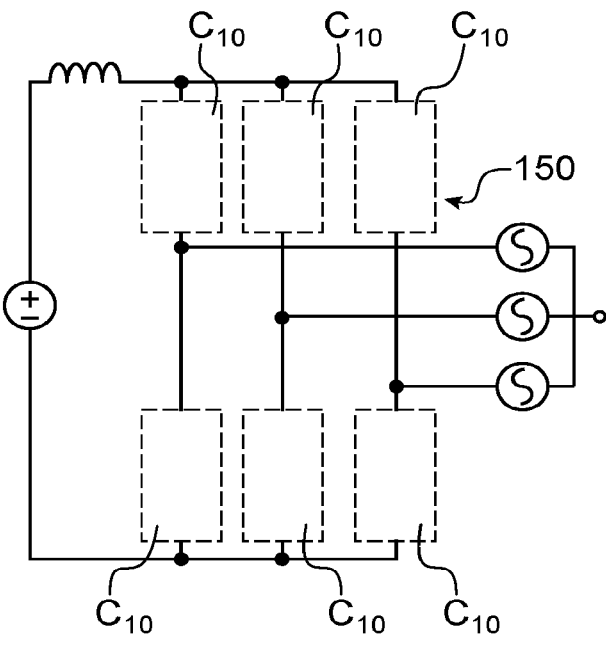
FIG. 15 is used to illustrate a DC/AC matrix converter, the elementary cells of which are each formed by a switching circuit bidirectional in voltage and current and implemented according to the present invention.

A third example of use shown in FIG. 15 relates this time to a converter of the DC/AC type and the cells 150 of which each integrate at least one switching circuit $C_{10}$ described above.

The invention claimed is:

1. A switching circuit forming a bidirectional switch between a first node and a second node and resting on a substrate, the substrate being covered with a heterojunction band forming an active zone in which an electron gas may be formed, said switching circuit being provided:

with a first branch formed, between an end connected to the first node and another end connected to the second node by a first diode in series with a first heterojunction field-effect transistor, and with a second branch formed, between an end connected to the first node and another end connected to the second node by a second heterojunction field-effect transistor in series with a second diode, the first branch and the second branch being mounted in parallel to one another and so that the first diode and the second diode are arranged in anti-series or antiparallel with respect to one another, the first transistor, the second transistor being each provided with a control gate facing said heterojunction band, the first diode being a Schottky diode provided with a metal electrode called first metal electrode in contact with said heterojunction band, the second diode being a Schottky diode provided with a metal electrode called second metal electrode in contact with said heterojunction band, the first diode, the first transistor, the second diode, the second transistor sharing said same active zone, wherein said switching circuit includes, facing the active zone in a first direction x parallel to a main plane of the substrate, a first conduction electrode of the second transistor, the control gate of the second transistor, the first metal electrode, the second metal electrode, the control gate of the first transistor, a first conduction electrode of the first transistor, the first metal electrode and the second metal electrode being arranged between the control gate of the second transistor and the control gate of the first transistor, and wherein the first metal electrode and the second metal electrode extend parallel to a second direction, orthogonal to the first direction, and have respective lengths measured parallel to the second direction smaller than a width of the active zone measured in the second direction, so that in the second direction a portion of the active zone located in the extension of the first metal electrode is not covered by the first metal electrode and so that in the second direction another portion of the active zone located in the extension of the second metal electrode is not covered by the second metal electrode, said portions not covered by the metal electrodes forming respectively a channel region for the first transistor and the second transistor.

2. The switching circuit according to claim 1, wherein the first transistor and the second transistor include a second conduction electrode, the second conduction electrode being shared by the first transistor and the second transistor, said second shared conduction electrode being arranged between the first metal electrode and the second metal electrode.

3. The switching circuit according to claim 1, the first transistor and/or the second transistor having a first conduction electrode and a second conduction electrode formed by an ohmic contact.

4. The switching circuit according to claim 1, wherein the first transistor and the second transistor each include a first conduction electrode comprising a metal zone in contact with said heterojunction band, and wherein the first transistor and the second transistor include a second conduction electrode formed by a zone of said heterojunction band.

5. The switching circuit according to claim 1, wherein said heterojunction band is surrounded by a structure comprising one of an insulating zone or a doped zone configured to prevent diffusion of the electron gas around said heterojunction band.

6. The switching circuit according to claim 5, wherein the doped zone is doped with argon.

7. The switching circuit according to claim 1, wherein said first and second transistors are high-electron-mobility transistors, said heterojunction band being formed by a first semiconductor layer stacked on a second semiconductor layer.

8. The switching circuit according to claim 7, wherein the first semiconductor layer contains AlGaN and the second semiconductor layer is made of GaN.

9. A power electronic device comprising a converter, provided with a plurality of switching cells, each switching cell being provided with the switching circuit according to claim 1.

* * * * *